US008829997B1

(12) United States Patent
Morkner

(10) Patent No.: US 8,829,997 B1
(45) Date of Patent: Sep. 9, 2014

(54) MONOLITHIC INTEGRATED POWER REGULATION FOR POWER CONTROL AND/OR BIAS CONTROL

(71) Applicant: M/A-COM Technology Solutions Holdings, Inc., Lowell, MA (US)

(72) Inventor: Henrik Morkner, Palo Alto, CA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 50 days.

(21) Appl. No.: 13/658,140

(22) Filed: Oct. 23, 2012

(51) Int. Cl.
*H03G 3/10* (2006.01)

(52) U.S. Cl.
USPC .......................................... 330/285; 330/129

(58) Field of Classification Search
USPC .................. 330/285, 296, 129, 136
See application file for complete search history.

(56) References Cited

U.S. PATENT DOCUMENTS

| | | | | |
|---|---|---|---|---|
| 5,367,268 A * | 11/1994 | Baba | .............................. | 330/129 |
| 5,826,177 A | 10/1998 | Uno | .............................. | 455/126 |
| 5,852,770 A | 12/1998 | Kasamatsu | ..................... | 455/126 |
| 5,977,831 A * | 11/1999 | Davis et al. | .................... | 330/279 |
| 6,185,431 B1 | 2/2001 | Li et al. | ........................... | 455/522 |
| 6,215,987 B1 | 4/2001 | Fujita | .............................. | 455/127 |
| 6,275,105 B1 | 8/2001 | Ghannouchi et al. | .......... | 330/151 |
| 6,873,208 B2 * | 3/2005 | Shinjo et al. | ................... | 330/129 |
| 6,920,334 B1 | 7/2005 | Karsi et al. | ..................... | 455/522 |
| 7,187,062 B2 | 3/2007 | Frank | .............................. | 257/664 |
| 7,340,228 B2 * | 3/2008 | Monroe et al. | .............. | 455/127.1 |
| 8,093,948 B2 * | 1/2012 | Kim et al. | ...................... | 330/136 |
| 8,354,883 B2 * | 1/2013 | Koo et al. | ...................... | 330/136 |

* cited by examiner

*Primary Examiner* — Henry Choe
(74) *Attorney, Agent, or Firm* — Christopher P. Maiorana, PC

(57) ABSTRACT

An apparatus comprising a power amplifier and a control circuit. The power amplifier may be configured to generate an output signal in response to an input signal and a control signal. The control circuit may be configured to present (i) a bias signal as the control signal during un-regulated conditions and (ii) a power down voltage as the control signal when one or more predetermined design parameters are exceeded. The magnitude of the control signal may be configured to dynamically adjust a power level of the output signal. The power down voltage may be generated by sampling the input signal.

16 Claims, 8 Drawing Sheets

MONOLITHIC INTEGRATED POWER REGULATION FOR POWER CONTROL AND/OR BIAS CONTROL

FIELD OF THE INVENTION

The present invention relates to bias control circuits generally and, more particularly, to a method and/or apparatus for implementing a monolithic integrated power regulation circuit for power detection and/or bias control.

BACKGROUND OF THE INVENTION

Conventional Radio Frequency (RF), microwave, and millimeter wave power transmission systems transmit power within a given specified operating range. The operating range is typically regulated on a system level, where the output power is monitored, processed, and fed back for gain control.

Such conventional systems use a coupler to sample a fractional amount of transmitted high frequency power. The high frequency power is then fed into a detection circuit which is typically a diode rectification and charge storage circuit which extracts the RMS DC voltage equivalent of the high frequency signal. The DC signal is then fed into a signal control block that relates the detected voltage to a calibrated table that relates DC voltage to measured output power. The desired output power is compared to the actual power, and the resulting delta is stored. The signal control unit then calculates what control signal is needed for gain control to achieve the delta. The control signal is then sent to the gain control unit which then attenuates or amplifies the signal. The system repeats this cycle until the requested output power is achieved.

The accuracy and speed of such a power regulation system is highly dependent on the total error of the number of elements the control signal must pass through. There is also a relatively long time lag through all the system elements resulting in a slow control loop. Such a system is also rather large, implementing the coordination of many elements, voltage translations, and comparisons.

It would be desirable to implement a monolithic integrated power regulation utilizing power detection for bias control.

SUMMARY OF THE INVENTION

An apparatus comprising a power amplifier and a control circuit. The power amplifier may be configured to generate an output signal in response to an input signal and a control signal. The control circuit may be configured to present (i) a bias signal as the control signal during un-regulated conditions and (ii) a power down voltage as the control signal when one or more predetermined design parameters are exceeded. The magnitude of the control signal may be configured to dynamically adjust a power level of the output signal. The power down voltage may be generated by sampling the input signal.

The objects, features and advantages of the present invention include providing a bias control circuit that may (i) provide monolithic integrated power regulation, (ii) use power detection for bias control, (iii) use a small amount of chip real estate, (iv) be monolithically implemented, (v) be implemented using the same process elements as a power amplifier, (vi) provide thermal runaway protection and/or (vii) be easy to implement.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

In a representative embodiment, the present invention may concern a control circuit that may include a coupler, a detector, and a signal adjustment circuit that may be integrated on a semiconductor substrate (e.g., Gallium Arsenide (GaAs), Silicon Germanium (SiGe), Gallium Nitride (GaN), Silicon, etc.). A detected voltage may be routed monolithically directly back to the power amplifier bias circuitry to be used as a bias control. A detected voltage may be connected through an analog interface back to the power amplifier.

Figure 1:
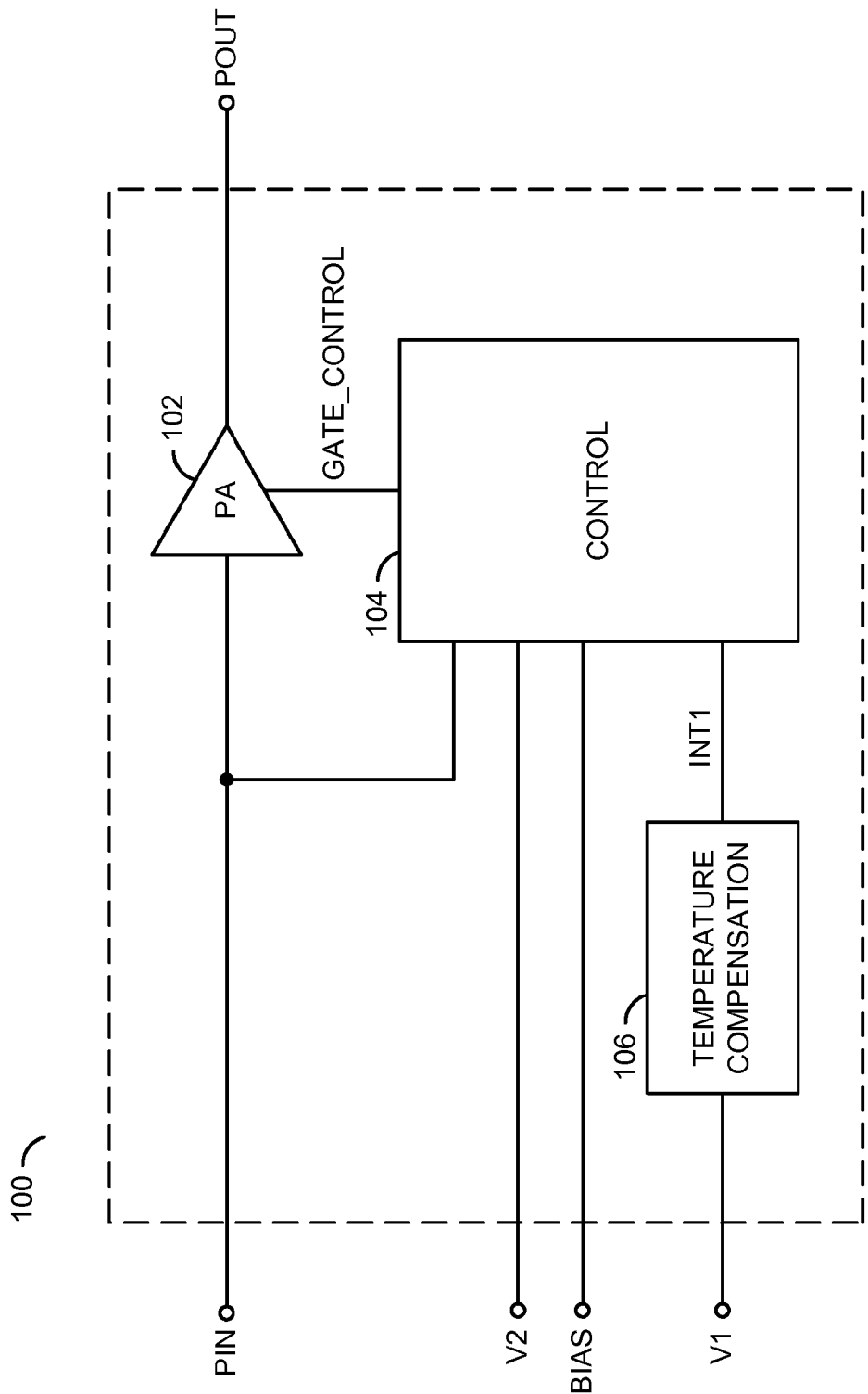
FIG. 1 is a block diagram of an embodiment of the present invention.

Referring to FIG. 1, a block diagram of a circuit 100 is shown in accordance with an embodiment of the present invention. The circuit 100 may be implemented as a self regulated power amplifier (SRPA). The regulation may be based on (or respond to) a power level of an input signal (e.g., PIN). The signal PIN may be implemented, in one example, as an analog input signal. The circuit 100 generally comprises a block (or circuit) 102, a block (or circuit) 104, a block (or circuit) 106. The circuit 102 may be implemented as a power amplifier circuit. The circuit 104 may be implemented as a control circuit. The circuit 106 may be implemented as a temperature compensation circuit.

The amplifier circuit 102 may receive the signal PIN, and a signal (e.g., GATE_CONTROL). The amplifier circuit 102 may generate a signal (e.g., POUT) in response to the signal PIN and the signal GATE_CONTROL. The signal POUT may be an output signal. In general, the amplifier 102 may generate the signal POUT having a voltage and/or power higher than the input signal PIN. The signal GATE_CONTROL may be used to control the operation and/or amount of amplification and/or power of the amplifier 102. The signal GATE_CONTROL may be presented to an input on the circuit 102 that may be configured to receive a quiescent (or threshold) voltage.

The circuit 106 may receive a signal (e.g., V1). The circuit 110 may present a signal (e.g., INT1) to the circuit 104. The circuit 104 may receive a signal (e.g., BIAS) and a signal (e.g., V2). The circuit 104 may generate the signal GATE_CONTROL. The control circuit 104 may present the signal GATE_CONTROL as either the signal BIAS or a modified version of the signal BIAS used to dynamically control the output power of the amplifier 102. A range of adjustments may be implemented based on the input signal PIN. In general, the modified version of the magnitude of the signal GATE_CONTROL may be generated by sampling the signal PIN (or the signal POUT). Since the amplifier 102 and the control circuit 104 are implemented on a monolithically integrated circuit, a feedback path through one or more bond pads and/or input pins is not needed to provide the dynamic control.

Figure 2:
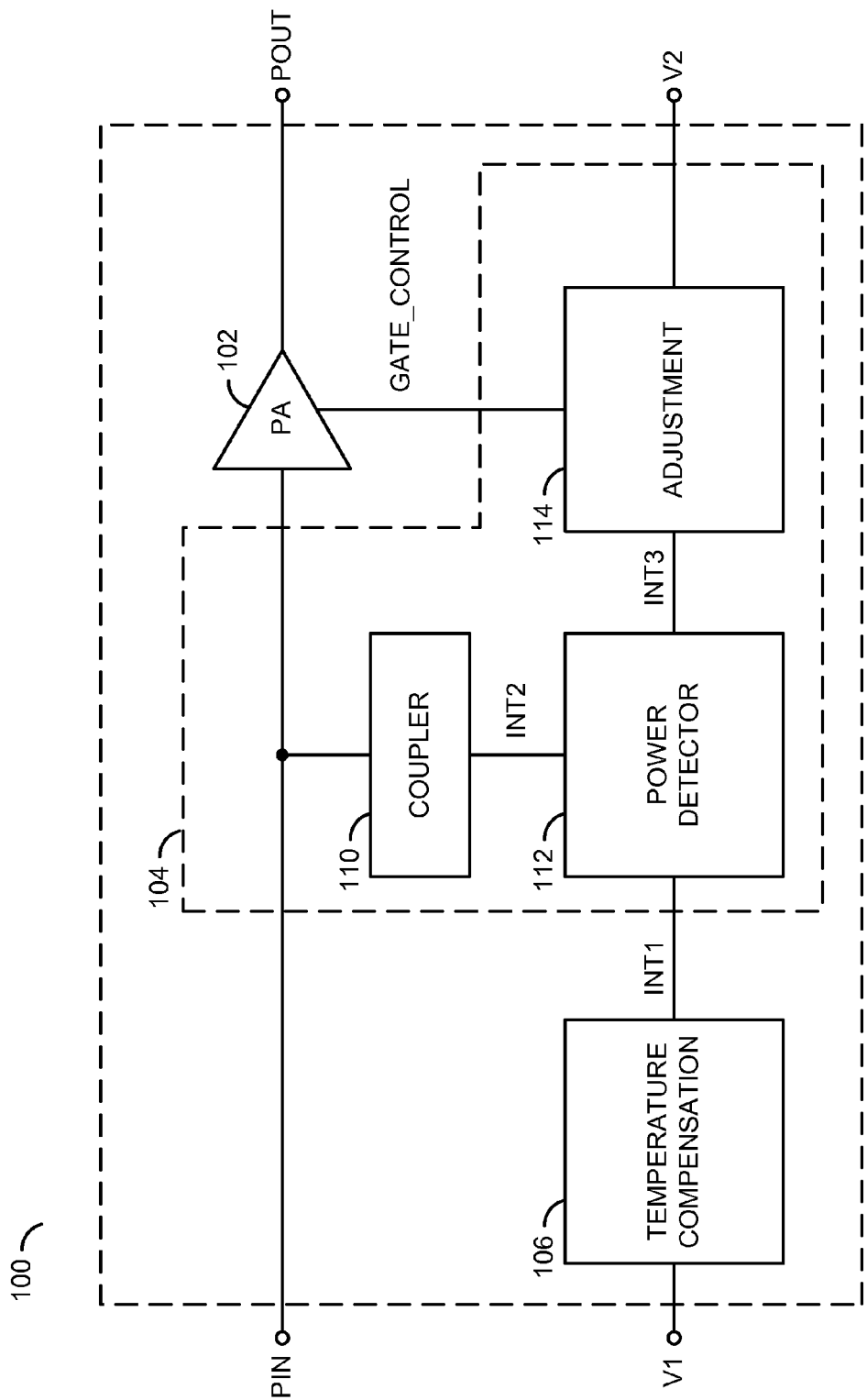
FIG. 2 is a more detailed block diagram of an embodiment of the present invention.

Referring to FIG. 2, a more detailed diagram of the circuit 104 is shown. The circuit 104 generally comprises a block (or circuit) 110, a block (or circuit) 112 and a block (or circuit) 114. The circuit 110 may be implemented as a coupler circuit. The circuit 112 may be implemented as a power detection circuit. The circuit 114 may be implemented as an adjustment circuit.

The circuit 112 may present a signal (e.g., INT2) in response to the signal PIN. The circuit 112 may present a signal (e.g., INT3) in response to the signal INT1 and the signal INT2. The circuit 114 may present the signal GATE_CONTROL in response to the signal INT3 and the signal V2. The signal INT1 may be an intermediate signal generated in response to the circuit 106. The signal INT3 may be an intermediate signal generated in response to the signal INT1 and the signal INT2. The signal GATE_CONTROL may be used to control the amplifier 102.

Figure 3:
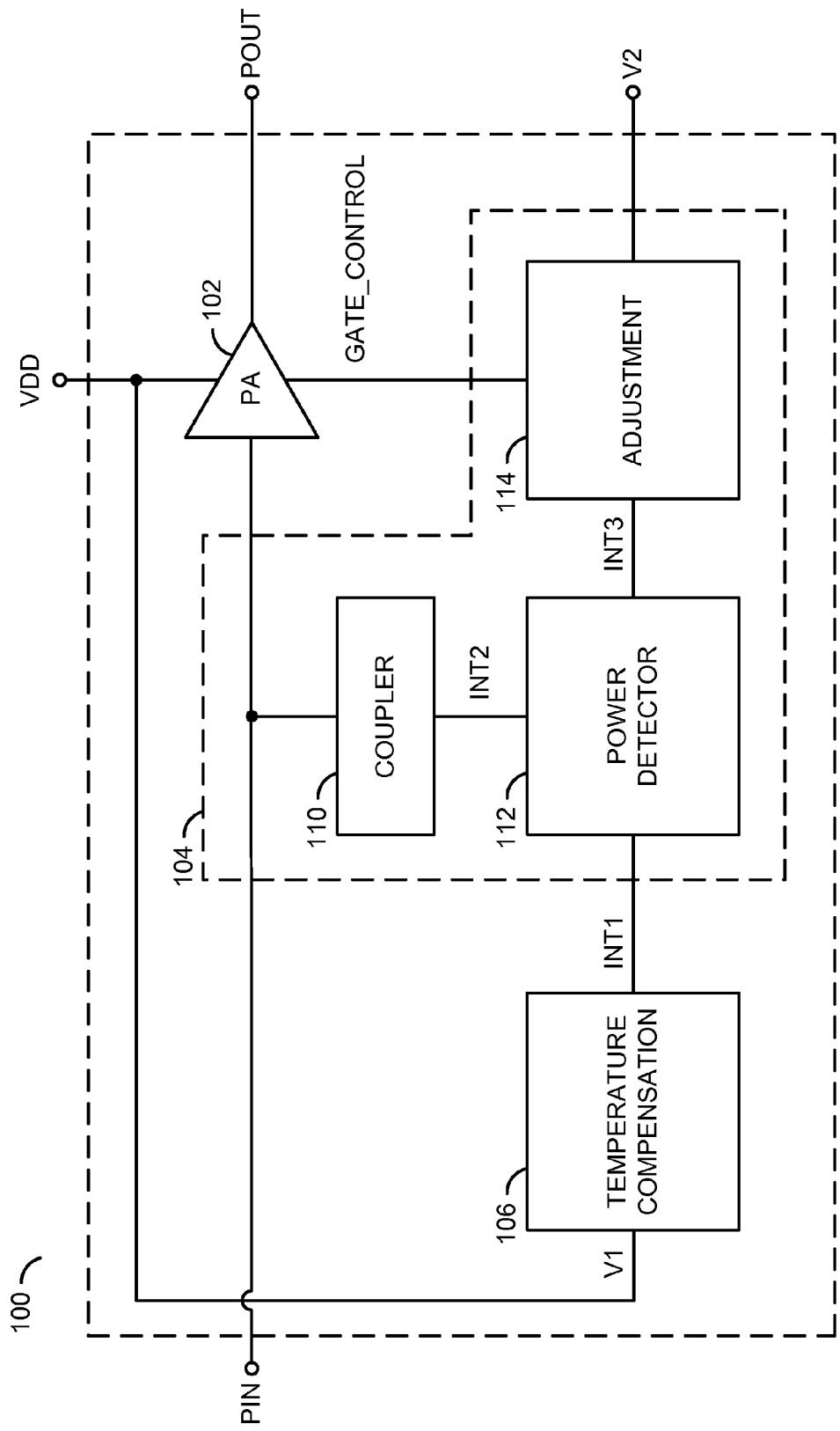
FIG. 3 is an embodiment of the invention showing a supply voltage used as an input to the control circuit.

Referring to FIG. 3, a more detailed diagram of the circuit 100 is shown. A supply voltage (e.g., VDD) is shown presented to the amplifier 102. The supply voltage VDD may also be used to generate the signal V1 presented to the temperature compensation circuit 110. In an example where the amplifier 102 is implemented as an enhancement mode device, the magnitude of the signal V1 is generally positive. In an example where the amplifier 102 is implemented as a depletion mode device (described in more detail in connection with FIG. 7), the magnitude of the voltage V1 is generally negative. Additionally, the temperature compensation circuit 106 may be implemented as an optional circuit and may be used to fine tune the level of adjustment provided by the control circuit 104. The temperature compensation circuit 106 may not be needed in certain design specifications.

Figure 4:
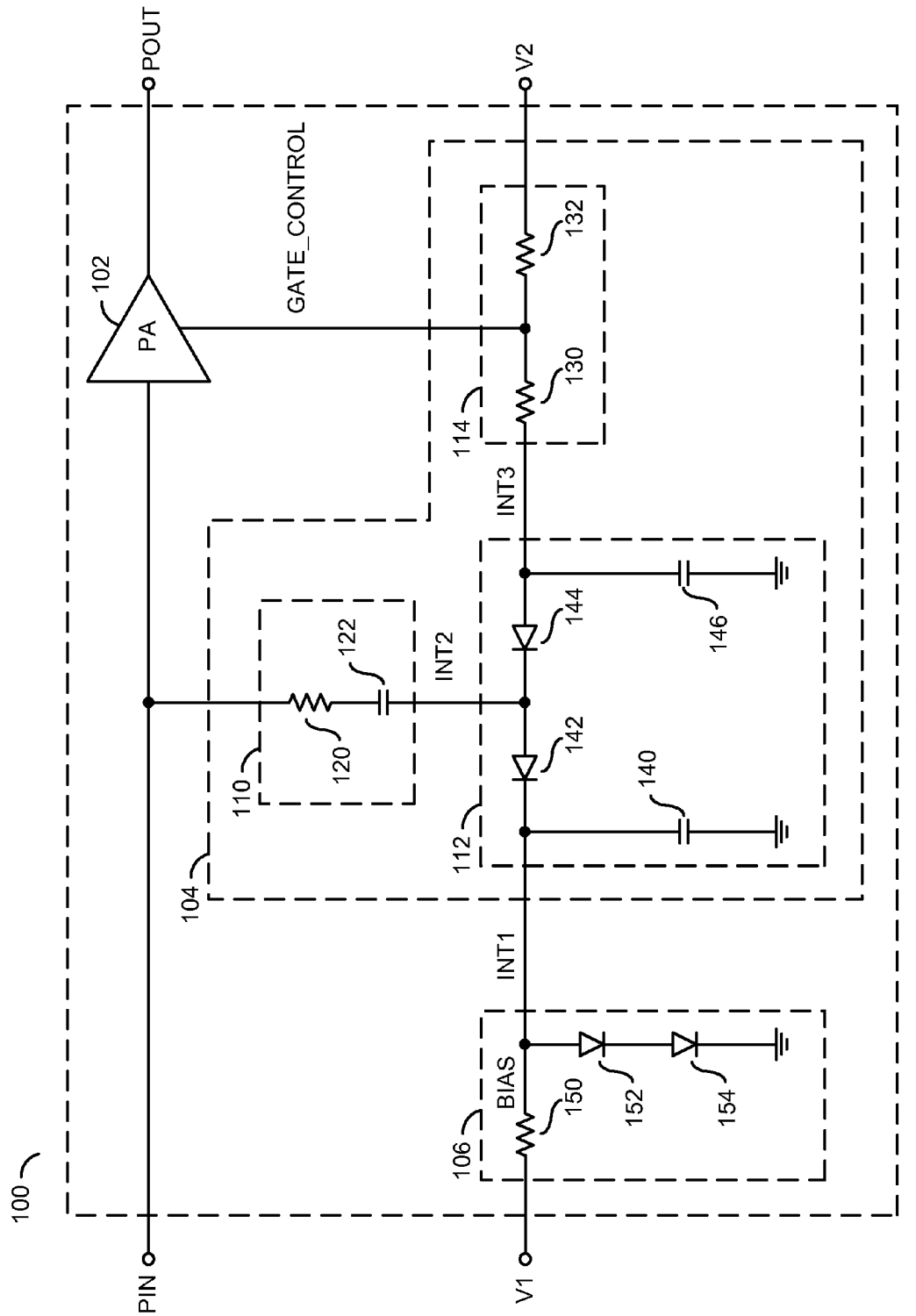
FIG. 4 is a more detailed diagram illustrating a monolithic power regulation system based on a magnitude of an input signal.

Referring to FIG. 4, a more detailed diagram of the circuit 100 is shown. The circuit 110 generally comprises an element (or circuit) 120 and an element (or circuit) 122. The circuit 120 may be implemented as a resistor. The element 122 may be implemented as a capacitor. The resistor 120 may be used to couple the signal PIN to the detector circuit 112. The capacitor 122 may be implemented as a DC blocking capacitor. While the element 110 has been shown implemented as a resistor and a capacitor, the particular implementation of the element 110 may be varied to meet the design criteria of a particular implementation. For example, certain implementations may be used with implementing with only the resistor 120. In general, the coupler 110 may take a small amount of the signal PIN (e.g., in the range of about 1%) to be used to generate the signal GATE_CONTROL.

The circuit 114 generally comprises an element (or circuit) 130 and an element (or circuit) 132. The elements 130 and 132 may be implemented as resistors. The resistors 130 and 132 may form a voltage divider. The values of the resistors 130 and/or 132 may be selected to adjust a value of the signal GATE_CONTROL. The circuit 112 generally comprises an element (or circuit) 140, an element (or circuit) 142, an element (or circuit) 144 and an element (or circuit) 146. The element 140 may be implemented as a capacitor. The element 142 may be implemented as a diode. The element 144 may also be implemented as a diode. The element 146 may be implemented as a capacitor. The capacitors 140 and 146 may be implemented as charge storage devices. The diodes 142 and 144 may be implemented as detector devices.

The circuit 106 generally comprises an element (or circuit) 150, an element (or circuit) 152 and an element (or circuit) 154. The element 150 may be implemented as a resistor. The element 152 may be implemented as a diode. The element 154 may be implemented as a diode. The circuit 106 may create a signal (e.g., BIAS) to be presented as the intermediate signal INT1.

Figure 5:
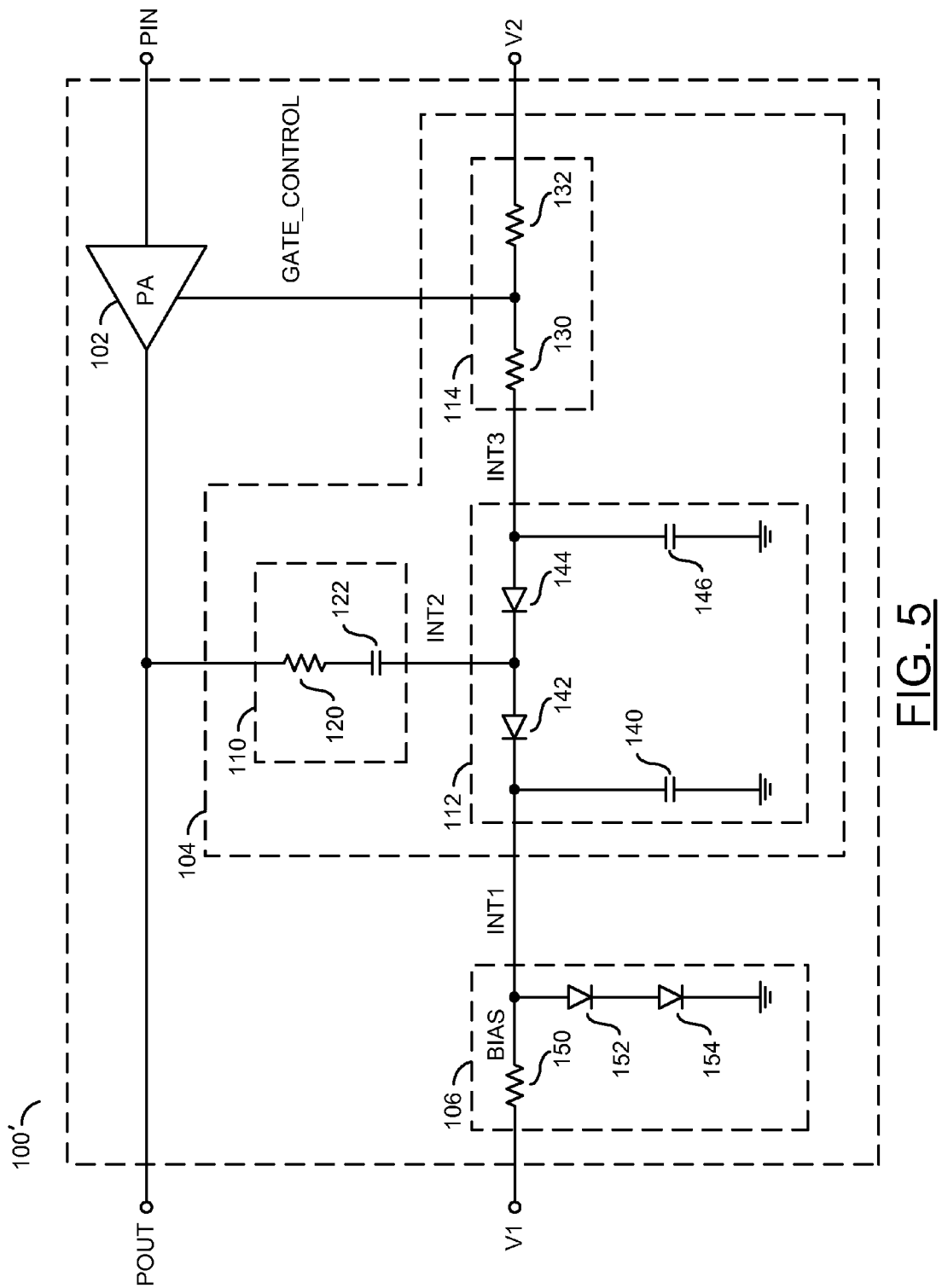
FIG. 5 is a more detailed block diagram illustrating monolithic power regulation based on a magnitude of an output signal.

Referring to FIG. 5, a more detailed block diagram of a circuit 100' is shown. The circuit 100' may respond to an output power level. In either the circuit 100 or the circuit 100', voltage regulation may be used to protect the power amplifier 102 if the input signal PIN or the output signal POUT is so powerful (or mis-matched so poorly) that the signal POUT could damage the power amplifier 102 (or a system the circuit 100 is implemented in). The circuit 110 and/or the circuit 112 may have a similar implementation in FIG. 2 and/or FIG. 3. The differences occur where the sample of the power for regulation is taken. The circuit 100 may be used to prevent oscillation of the amplifier 102 by monitoring the signal POUT. For example, a predetermined design parameter, such as a 1 W maximum output power, may be designed. If the output exceeds the 1 W max, the circuit 100' may adjust the signal GATE_CONTROL to reduce the overall power generated by the amplifier 102.

Figure 6:
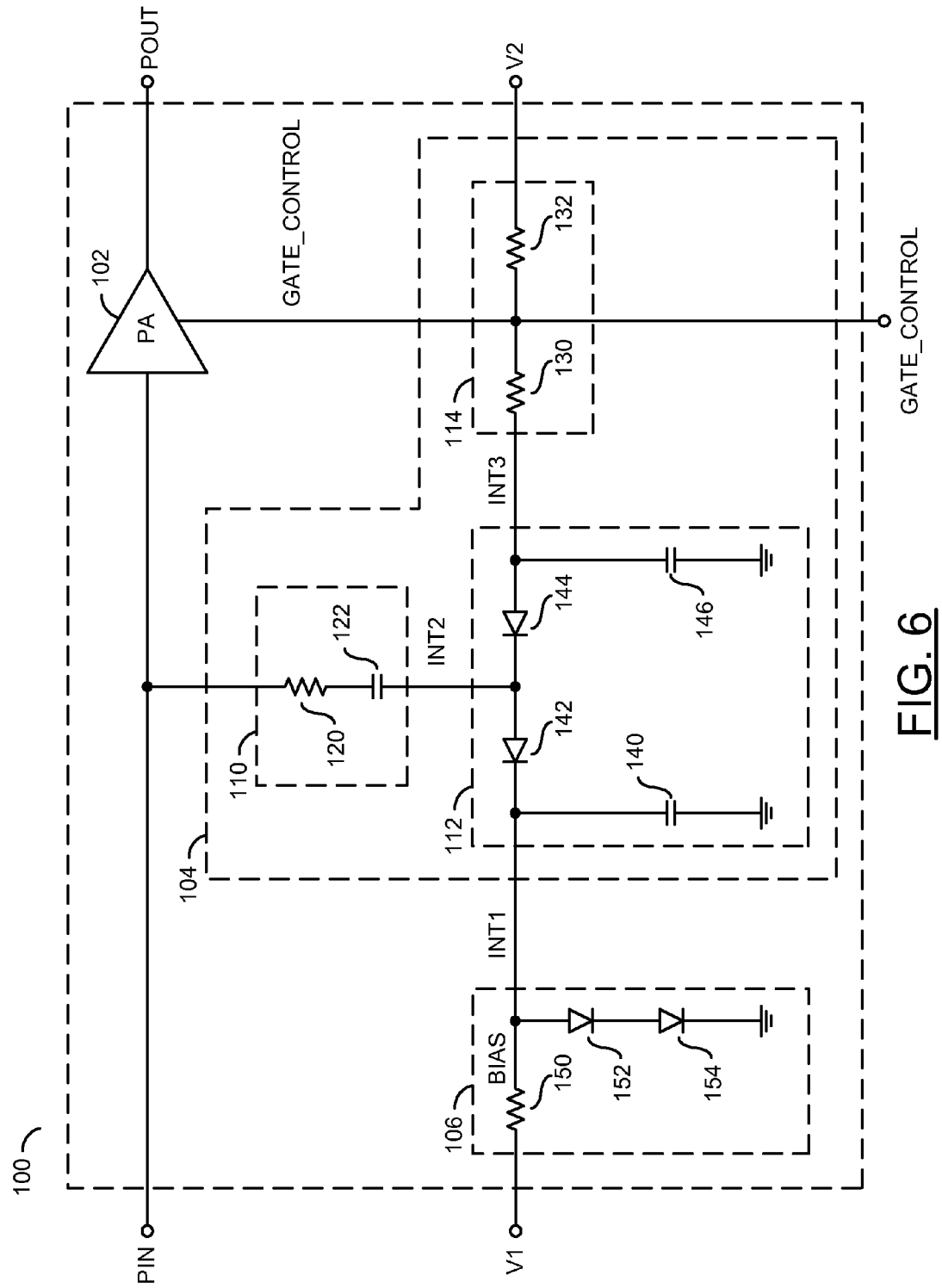
FIG. 6 is a diagram illustrating the gate control circuit presented as an output.

Referring to FIG. 6, an alternate implementation of the circuit 100 is shown. The signal GATE_CONTROL is shown presented to the control input of the amplifier 102. Additionally, the signal GATE_CONTROL is shown presented as an output. By presenting the signal GATE_CONTROL as an off-chip output, additional amplifiers (not shown) may be controlled. For example, an array of power amplifiers (e.g., 102a-102n) may be implemented. Each of the amplifiers 102a-102n may be controlled by the signal GATE_CONTROL.

Figure 7:
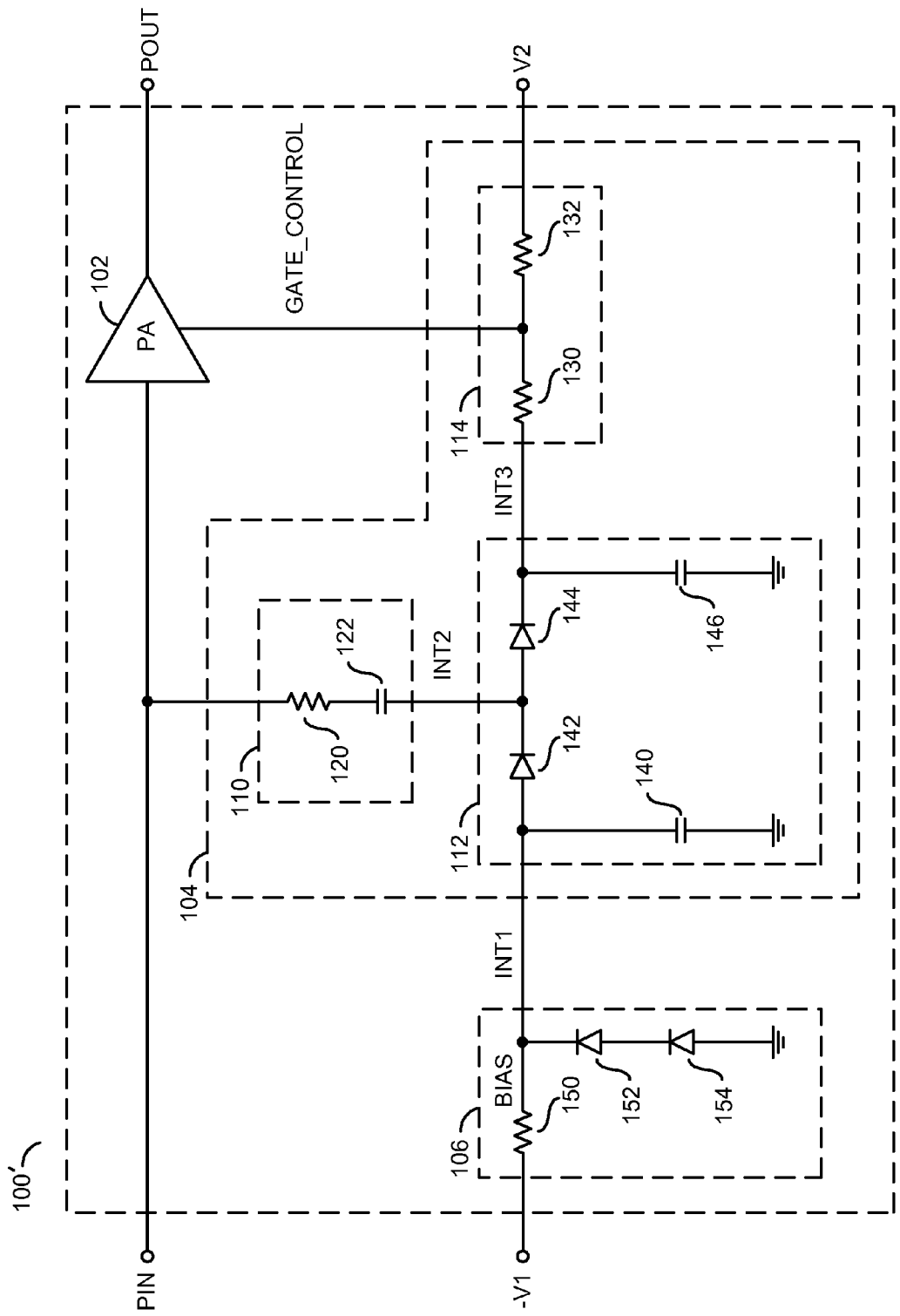
FIG. 7 is a diagram illustrating a depletion mode implementation.

Referring to FIG. 7, an example of a circuit 100' is shown. The circuit 100' may be implemented as a depletion-mode implementation. In such an example, the signal V1 may be implemented as a negative value (e.g., shown as −V1). In such an implementation, a negative value of the signal GATE_CONTROL may be needed in order to control the amplifier 102.

Figure 8:
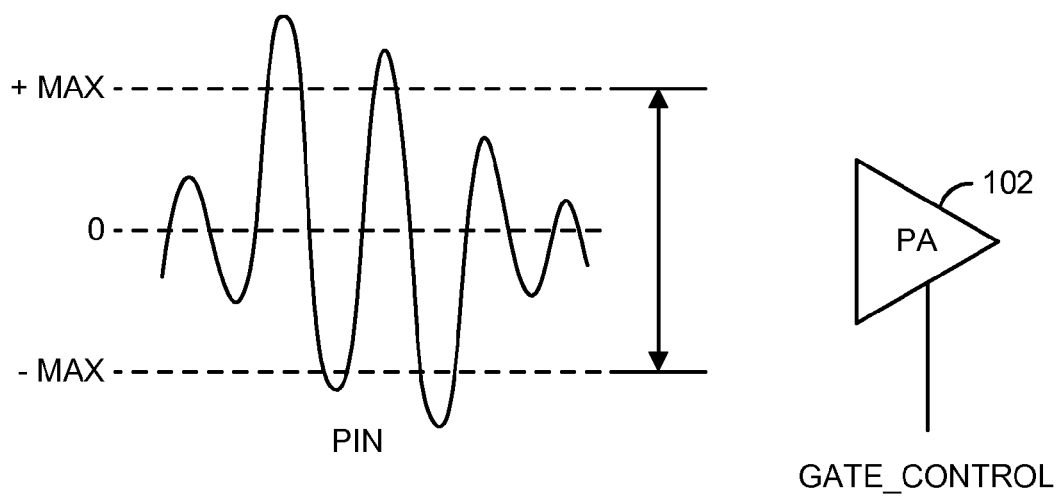
FIG. 8 is a wave diagram showing an example of how the gate control signal is generated.

Referring to FIG. 8, an example of a waveform implementing the signal PIN is shown. The waveform is shown oscillating above a value (e.g., +MAX) and below a value (e.g., −MAX). In such an implementation, the circuit 100 may detect that the signal PIN has exceeded a power level range that the amplifier 102 may safely operate. The circuit 100 may adjust the signal GATE_CONTROL to lower the overall power produced by the amplifier 102.

The circuit 100 may provide a compact, economical and/or performance consistent solution to power regulation when transmission rules and/or licensing regulations are enforced (e.g., in a frequency and/or mode agile wireless access system). The circuit 100 may be provided within (or otherwise connected to) various types of electronic devices configured for communication over infrastructure networks (e.g., Point-to-Point radio communication between tower, very small aperture terminal (VSAT), base stations, direct broadcast satellite (DBS), radar, instrumentation (e.g., radio astronomy, etc.) and/or other infrastructure electronic devices). Such devices may particularly benefit from high integration, small size and/or efficient control loops.

The power amplifier 102 may be configured to amplify various types of input signals VIN (e.g., radio frequency (RF), microwave, millimeter wave signals, etc.). Various signals may have different signal parameters. For example, different frequency bands and/or different power levels may be used for communications based on different standards. In one example, the power amplifier 102 may correspond to a pointto-point system connection between two cell phone towers operating at, for example, 23 GHz. In another example, the power amplifier 102 may be implemented in a VSAT system operating at 30 GHz (e.g., to transmit to a satellite). In both examples, the level of output power on the signal POUT is normally sharply regulated to a given regulatory specification. A manufacturer normally has the responsibility to make sure that the power amplifier does not exceed that amount over temperature, time, and/or external forces. The circuit 100 may be implemented to maintain compliance with such specifications.

The circuit 100 is not limited to Point-to-Point radio and/or VSAT operations, and is not limited to signal power amplifiers corresponding to each type of access point. The power levels and associated number and/or types of communication standards may vary to provide unique benefits for any particular situation and/or to meet application specific design specifications of various implementations.

The circuit 100 may receive an RF signal on the signal PIN. The signal PIN may be amplified with the power amplifier 102 and presented as the output signal POUT. The coupler 104 may be located between the signal PIN and the power amplifier 102 (FIG. 1) or between the power amplifier 102 and the output signal POUT (FIG. 6) depending on whether input or output power regulation is desired. In various embodiments, the coupler 104 may be implemented as a directional coupler. In one example, the coupler 104 may include the resistor 120 and the DC block capacitor 122. The coupler circuit 104 may be configured to sample a small amount of power (e.g., around 1%) from the signal PIN. The particular implementation of the coupler 104 may be varied and/or modified to meet the design criteria of a particular implementation.

The coupler 104 may be configured to feed a sample of the signal PIN into the detector circuit 112 as the signal INT2. The signal INT2 may be rectified and/or translated into the signal INT3 as an RMS DC voltage in response to the RF signal strength of the signal PIN. Such rectification may be implemented with the back-to-back configuration of the diodes 142 and/or 144. The diodes 152 and/or 154 may be used to compensate for the temperature effects of DC voltage on a particular diode. The capacitors 140 and/or 146 may be used to hold the voltage of the detector 112 long enough to be effective as a regulator. The detector diodes 142 and/or 144 may be configured to sample and hold a DC voltage from the RF signal. While the detector 112 is shown implemented with the detector diodes 142 and/or 144, as well as the capacitors 140 and/or 146, the particular devices used to design the circuit 112 may be varied to meet the design criteria of a particular implementation.

The circuit 106 may set the base level current through the regulator circuitry (e.g., presented as the signal INT1). In one example, the resistor 150 may be implemented. The amount of current on the signal INT1 may adjust the sensitivity and/or range of the circuit 100. The voltage divider 106, and the resistors 130 and/or 132 are set to provide the desired voltage at the gate control port of power amplifier 102 in conjunction with the voltage V1 and the voltage V2. The voltage V1 (e.g., a DC supply), the voltage V2, and/or the resistors 130 and/or 132 may be set to match or provide the "normal" signal GATE_CONTROL for the power amplifier 102. For example, in a typical depletion mode power amplifier, the signal GATE_CONTROL may be −0.5V. By placing the voltage V2 at 0V (e.g., GND) and the voltage V1 lower than a pinch-off (or threshold) voltage (e.g., typically less than −2V when the amplifier 102 shuts off), the resistors 130 and/or 132 may adjust the signal GATE_CONTROL to be the desired −0.5V.

During regulation, the signal GATE_CONTROL may move down in voltage as the power generated by the amplifier 102 increases. In general, the coupler 104 samples the RF signal PIN and the detector 112 provides more negative voltage to the voltage divider 106. This in turn reduces the amplification and/or output power of the power amplifier 102. The duration of the power regulation is set with a time constant of the capacitor 140 and/or the capacitor 142.

The circuit 100 may provide a monolithic implementation that may be built to include the amplifier 102 on a single semiconductor substrate (e.g., GaAs, GaN, etc.). The circuit 100 may monitor the RF power of the amplifier 102 and/or provide a DC voltage to regulate the power amplifier 102. The circuit 100 may be integrated with the power amplifier 102 to provide active regulation typically used to protect the power amplifier 102 and/or surrounding systems from overdrive and/or damage.

The circuit 100 may be used to interface with multiple different types of network access points (e.g., multiple power amplifiers, switches and/or power detecting circuits). The power amplifiers are configured to provide corresponding signals associated with the different types of network access points, each signal having at least one parameter different than a corresponding parameter in another signal. The switch is configured to select one of the signals to provide an output signal. The power detecting circuit 112 is configured to detect power of the output signal, and includes multiple states corresponding to the multiple different types of network access points. The power detecting circuit 112 generates a voltage level within the same voltage range for the signals in response to the multiple states corresponding to the different types of network access points with which the signals are associated.

While the invention has been particularly shown and described with reference to the preferred embodiments thereof, it will be understood by those skilled in the art that various changes in form and details may be made without departing from the scope of the invention.

The invention claimed is:

1. An apparatus comprising:
 a power amplifier configured to generate an output signal in response to (i) an input signal and (ii) a control signal; and
 a control circuit configured to present (i) a bias signal as said control signal during un-regulated conditions and (ii) a power down voltage as said control signal when one or more predetermined design parameters are exceeded, wherein (a) a magnitude of said control signal is configured to dynamically adjust a power level of said output signal, (b) said power down voltage is generated by sampling said input signal and (c) said control circuit includes an adjustment circuit comprising a biasing and voltage dividing network of a plurality of resistors, said adjustment circuit configured to generate said control signal.

2. The apparatus according to claim 1, wherein said control circuit further comprises:
 a coupler (i) connected in parallel with the power amplifier and (ii) configured to provide a power regulation signal in response to said input signal; and
 a power detection circuit configured to provide a DC voltage signal in response to (i) the power regulation signal and (ii) a supply voltage.

3. The apparatus according to claim 2, wherein said power amplifier, said coupler, said power detection circuit and said control circuit are implemented on a single integrated circuit (IC).

4. The apparatus according to claim 3, wherein a semiconductor substrate for implementing said integrated circuit is selected from a group consisting of silicon, gallium arsenide, and gallium nitride.

5. The apparatus according to claim 2, wherein the power detection circuit further comprises:
   a plurality of passive elements configured to match base conditions for gate control of the power amplifier.

6. The apparatus according to claim 4, wherein the power detection circuit further comprises:
   a plurality of active elements configured to match base conditions for gate control of the power amplifier.

7. The apparatus according to claim 1, wherein said control circuit is configured to sample a small amount of power from the power amplifier.

8. The apparatus according to claim 6, wherein said sample is from an output of the power amplifier.

9. The apparatus according to claim 6, wherein said sample is from an input of the power amplifier.

10. The apparatus according to claim 1, wherein said apparatus provides power regulation based on a power level of said power amplifier.

11. The apparatus according to claim 2, wherein the power detection circuit further comprises:
    an RF power to DC voltage generation circuit configured to charge hold the DC voltage over a sample period.

12. The apparatus according to claim 10, further comprising a temperature compensation circuit.

13. The apparatus according to claim 1, wherein said apparatus is implemented using a plurality of Gallium Nitride transistors.

14. A method for controlling a power amplifier comprising the steps of:
    (A) generating an output signal in response to (i) an input signal and (ii) a control signal; and
    (B) generating a bias signal as said control signal during un-regulated conditions; and
    (C) generating a power down voltage as said control signal when one or more predetermined design parameters are exceeded, wherein (a) a magnitude of said control signal is configured to dynamically adjust a power level of said output signal, (b) said power down voltage is generated by sampling said input signal and (c) said control signal is generated by an adjustment circuit comprising a biasing and voltage dividing network of a plurality of resistors.

15. An apparatus comprising:
    a power amplifier configured to generate an output signal in response to (i) an input signal and (ii) a control signal; and
    a control circuit configured to present (i) a bias signal as said control signal during un-regulated conditions and (ii) a power down voltage as said control signal when one or more predetermined design parameters are exceeded, wherein (A) a magnitude of said control signal is configured to dynamically adjust a power level of said output signal, (B) said power down voltage is generated by sampling said input signal, (C) said control circuit further comprises (a) a coupler (i) connected in parallel with the power amplifier and (ii) configured to provide a power regulation signal in response to said input signal, (b) a power detection circuit configured to provide a DC voltage signal in response to (i) the power regulation signal and (ii) a supply voltage and (c) an adjustment circuit configured to generate said control signal, (D) said power amplifier, said coupler, said power detection circuit and said control circuit are implemented on a single integrated circuit (IC), (E) a semiconductor substrate for implementing said integrated circuit is selected from a group consisting of silicon, gallium arsenide, and gallium nitride (F) the power detection circuit further comprises a plurality of active elements configured to match base conditions for gate control of the power amplifier, and (G) said sample is from an output of the power amplifier.

16. The apparatus according to claim 15, wherein said adjustment circuit comprises a biasing and voltage dividing network of a plurality of resistors.

* * * * *